(12) United States Patent
Oprea

(10) Patent No.: US 11,810,929 B2
(45) Date of Patent: Nov. 7, 2023

(54) INDEXED PIXEL IMAGE ACQUISITION DEVICE

(71) Applicant: Radu Oprea, Lake Oswego, OR (US)

(72) Inventor: Radu Oprea, Lake Oswego, OR (US)

( * ) Notice: Subject to any disclaimer, the term of this patent is extended or adjusted under 35 U.S.C. 154(b) by 70 days.

(21) Appl. No.: 17/490,237

(22) Filed: Sep. 30, 2021

(65) Prior Publication Data

US 2022/0068988 A1 Mar. 3, 2022

Related U.S. Application Data

(63) Continuation-in-part of application No. 17/009,724, filed on Sep. 1, 2020, now abandoned.

(51) Int. Cl.
*H01L 27/146* (2006.01)
*H04N 23/56* (2023.01)
*H04N 25/581* (2023.01)

(52) U.S. Cl.
CPC .. *H01L 27/14605* (2013.01); *H01L 27/14645* (2013.01); *H04N 23/56* (2023.01); *H04N 25/581* (2023.01); *H01L 27/14625* (2013.01)

(58) Field of Classification Search
CPC ...................................................... H04N 25/581
USPC ........................................................... 348/236
See application file for complete search history.

(56) References Cited

U.S. PATENT DOCUMENTS

2002/0140822 A1* 10/2002 Kahn ..................... H04N 23/60
348/207.99

* cited by examiner

*Primary Examiner* — Joel W Fosselman
(74) *Attorney, Agent, or Firm* — Lambert Shortell & Connaughton; David J. Connaughton, Jr.; Justin P. Tinger

(57) ABSTRACT

An innovative image acquisition device is disclosed, providing an effective solution for maximizing information density, while reducing color artifacts. The device of the invention relies on selective wavelength absorption, in certain substances. The novel solution utilizes two photosite arrays, or sensors, separated by an absorption layer, of predetermined thickness. Thus, an incident light beam strikes the two sensors in different proportions, exposing one array to the unaltered incident light, while the light striking the other array is partially absorbed. Light intensity ratio, between corresponding photosites on the two sensors uniquely identifies the incident light wavelength, and subsequently its color.

4 Claims, 5 Drawing Sheets

INDEXED PIXEL IMAGE ACQUISITION DEVICE

CROSS-REFERENCE TO RELATED APPLICATIONS

Not applicable

STATEMENT REGARDING FEDERALLY SPONSORED RESEARCH OR DEVELOPMENT

Not applicable

References

| Pat. No. | Inventor | Assignee | Date | Class |
|---|---|---|---|---|
| Pat. No. 6,330,113 | Slagle et al | Foveon, Inc. | Dec. 11 2001 | 359/64 |
| Pat. No. 6,794,627 | Lyon et al | Foveon, Inc. | Sep. 21, 2004 | 250/208.1 |
| Pat. No. 6,809,768 | Merrill | Foveon, Inc. | Oct. 26, 2004 | 348/308 |
| Pat. No. 6,864,557 | Turner et al | Foveon, Inc. | Mar. 8, 2005 | 257/440 |
| Pat. No. 6,934,050 | Merrill et al | Foveon, Inc. | Aug. 23, 2005 | 358/1.16 |
| Pat. No. 6,998,660 | Lyon et al | Foveon, Inc. | Feb. 14, 2006 | 257/294 |
| Pat. No. 7,053,998 | Hillis et al | Searete, LLC | May 30, 2006 | 356/213 |
| Pat. No. 7,098,439 | Hillis et al | Searete, LLC | Aug. 29, 2006 | 250/214 R |
| Pat. No. 7,110,028 | Merrill | Foveon, Inc. | Sep. 19, 2006 | 348/294 |
| Pat. No. 7,132,724 | Merrill | Foveon, Inc. | Nov. 7, 2006 | 257/440 |
| Pat. No. 7,164,444 | Merrill | Foveon, Inc. | Jan. 16, 2007 | 348/308 |
| Pat. No. 7,166,880 | Merrill et al | Foveon, Inc. | Jan. 23, 2007 | 257/294 |
| Pat. No. 7,220,959 | Nishimura | Avago Tech. | May 22, 2007 | 250/226 |
| Pat. No. 7,339,216 | Lyon et al | Foveon, Inc. | Mar. 4, 2008 | 257/291 |
| Pat. No. 7,365,771 | Kahn et al | Hewlett-Packard, L.P. | Apr. 29, 2008 | 348/207.99 |
| Pat. No. 7,411,620 | Taniguchi et al | FUJIFILM Corp. | Aug. 12, 2008 | 348/294 |
| Pat. No. 7,623,165 | Gruhlke et al | Aptina Imaging Corp. | Nov. 24, 2009 | 348/272 |
| Pat. No. 7,977,718 | Hannebauer et al | Lumiense Photonics, Inc. | Jul. 12, 2011 | 257/292 |
| Pat. No. 8,258,560 | Hynecek | Aptina Imaging Corp. | Sep. 4, 2012 | 257/292 |
| Pat. No. 8,395,685 | Granquist-Fraser | Charles Stark Draper Lab, Inc. | Mar. 12, 2013 | 348/296 |
| Pat. No. 8,946,845 | Hynecek | Aptina Imaging Corp. | Feb. 3, 2015 | 257/440 |
| Pat. No. 9,105,550 | Rhoads | Digimarc Corp. | Aug. 11, 2015 | H01L 27/14647 |
| Pat. No. 9,147,235 | Lukac et al | Foveon, Inc. | Sep. 29, 2015 | G06T 5/008 |
| Pat. No. 9,191,556 | Lukac et al | Foveon, Inc. | Nov. 17, 2015 | H04N 5/2173 |
| Pat. No. 9,257,475 | Kalevo et al | Nokia Technologies Oy | Feb. 9, 2016 | H01L 27/14645 |
| Pat. No. 9,642,532 | Fengler et al | Novadaq Technologies, Inc. | May 9, 2017 | A61B 5/0086 |
| Pat. No. 9,942,495 | Lukac et al | Foveon, Inc. | Apr. 10, 2018 | H04N 5/35563 |
| Pat. No. 10,043,843 | Mansoorian et al | Forza Silicon Corp. | Aug. 7, 2018 | H01L 27/14643 |
| US 2011/0134222 | Yahav | Microsoft International Holdings | | |

BACKGROUND OF THE INVENTION

The invention herein disclosed relates to the field of image acquisition devices, more specifically to digital cameras.

The majority of currently produced image sensor rely on the Bayer mosaic for capturing color information. This technique requires 4 distinct photo-elements for each image pixel (2 for Green, 1 for Red and 1 for Blue. The recorded RGB triplet is obtained by interpolation, across the 4 photo-elements. This, of course, entails some loss of information and may generate un-desired color artifacts.

A number of solutions have been suggested, to mitigate the loss of information inherent to the Bayer Mosaic sensor, the majority of which relying on stacked RGB photosites whereby 3 sensors are stacked at different depths within a silicon substrate. The best-known stacked RGB sensor is the one invented and produced by Foveon.

The Foveon concept is based on the selective light absorption in certain materials, including silicon, i.e. the absorption length is a function of wavelength. The Foveon sensor features three separate layers of photosensitive sensors, embedded in silicon. The first layer is placed at the blue absorption depth, the second layer at the green absorption length and the last layer at the red absorption length, which allows, in principle, each layer to only record one color.

The main disadvantages of this and other similar prior art solutions is severe vertical color leakage due to the large overlap of the red, green and blue channels. In reality, the blue layer will record not only blue, but also some red and green. A number of separation techniques have been devised and applied, but with only limited success.

Accordingly, the main objective of this invention is to provide a practical solution for maximizing the information density of an image acquisition sensor.

BRIEF SUMMARY OF THE INVENTION

The device of the invention embodies a novel utilization of the selective light wavelength absorption in certain media. Instead of employing a stack of three photosensitive layers, embedded at different depths, in a preferably silicon medium, the novel device of the invention only uses two precisely aligned photosensitive arrays, or sensors, wherein an incident light beam directly strikes one the two sensors, but the same beam only strikes the second sensor, after traversing a layer of selectively absorbing medium, e.g. silicon.

Each one of the two sensors contains an array of photosensitive elements, of a type well-known in the art, and hereinafter referred to as "photosites".

Due to its partial absorption, the emerging light beam reaching the second sensor is selectively attenuated, the light intensity ratio, at each pair of identically indexed, or homologous, photosites being a function of its wavelength.

Thus, by using the light intensity ratio, in combination with the unaltered intensity, it is possible to determine the light color, at each photosite.

A number of techniques exist, and are known in the art, to correlate light wavelength with the more commonly used Red-Green-Blue (RGB) triplet (e.g. Mihai et al in U.P.B. Science Bulleting, Series D, Vol. 69, No. 2, 2007).

OBJECTS AND ADVANTAGES

Accordingly, several objects and advantages of my invention are:
  Complete color information for each pixel, without the color leakage disadvantage of prior art designs.
  Ability to expand the dynamic ratio of the acquired image.
  One embodiment affords use of back-illuminated photosensitive elements.
  Simplified sensor construction.
  Maximize pixel density, for a predefined sensor size.
  Elimination of color artifacts induced by mosaic-based sensors, e.g. Bayer mosaic.

LIST OF REFERENCE LETTERS AND NUMERALS

10 Image Acquisition Device
11 Reference Sensor
12 Target Sensor
13 Selective Absorption Layer
14 Beam Splitter
15 Focusing Means
100 Incident Light Beam
101 First Light Beam
102 Second Light Beam
A Reference Photosite
A' Target Photosite
B Reference Photosite
B' Target Photosite
$I_1$ Incident Light Intensity
$I_{1A}$ First Incident Ray Reference Intensity
$I_{2B}$ Second Incident Ray Reference Intensity
$I_2$ Target Light Intensity
$I_{2A}$ First Incident Ray Target Intensity
$I_{2B}$ Second Incident Ray Target Intensity
L1 First Light Source
L2 Second Light Source
$W_1$ First Incident Ray
$W_2$ Second Incident Ray
$\lambda_1$ First Incident Light Ray Wavelength
$\lambda_2$ Second Incident Light Ray Wavelength

DETAILED DESCRIPTION OF THE INVENTION

Figure 1:
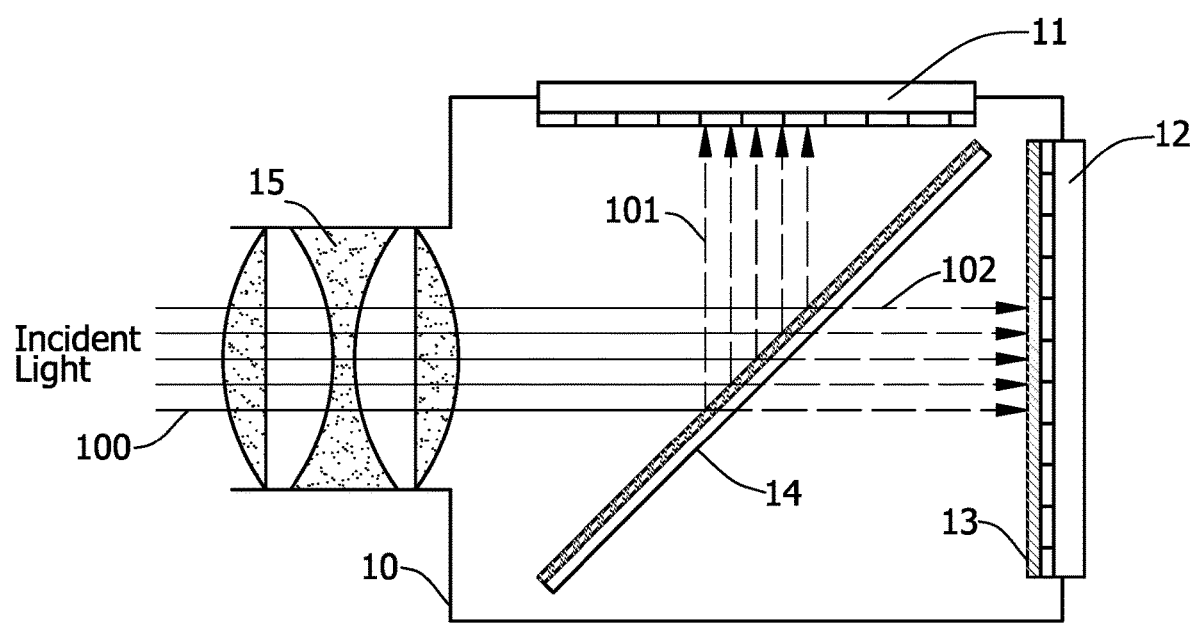
FIG. 1 is a schematic representation of the preferred embodiment of the invention.

FIG. 1 presents the preferred embodiment of the proposed solution.

An incident light beam, 100, enters an image acquisition device 10, such as a digital camera, said image acquisition device comprising a reference sensor 11, a target sensor 12 and a selective absorption layer, 13, of predetermined thickness, said selective absorption layer being constructed from a material, e.g. silicon, which absorbs light of different wavelengths selectively.

In its preferred embodiment, the device of the invention further comprises a beam splitter 14, of a kind well-known in the art, e.g. a partially reflective mirror, or prism.

Each one of the two sensors contains an array of photosensitive elements, or photosites.

Although not compulsory for the description, or operation of the invention, the image acquisition device usually also comprises a focusing means, 15, such as an optical lens. Also present, but not explicitly enumerated, are measurement and processing means, for determining the intensity of the light, at each photosite and for evaluating the light intensity relationship, between different photosites. Such electrical and, or, computational devices are routine in the art and require no special description.

Figure 2:
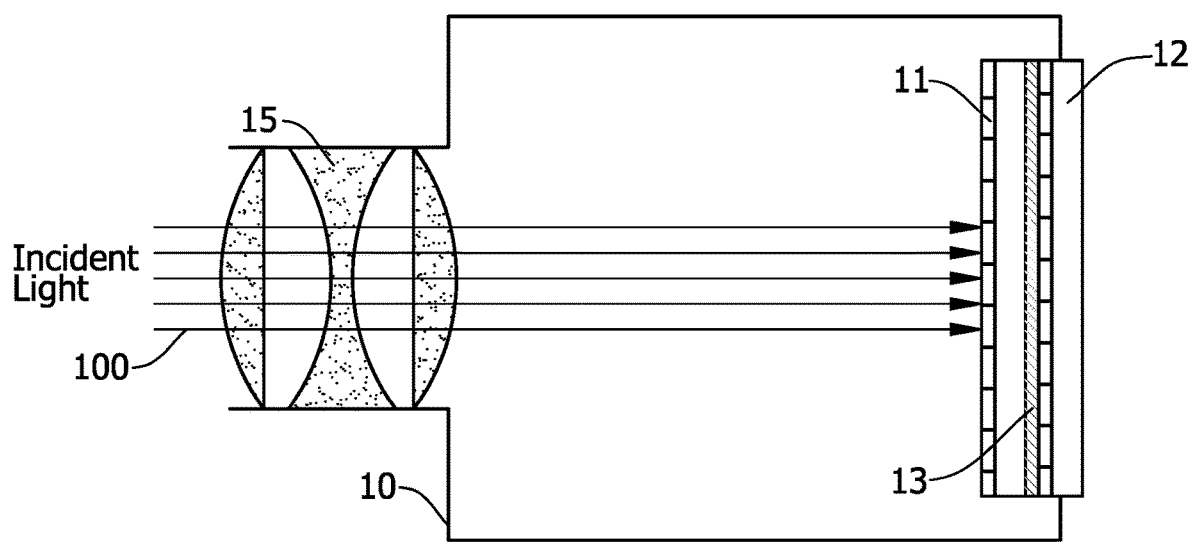
FIG. 2 shows an alternative, and functionally equivalent, embodiment of the invention.

FIG. 2 shows an alternative embodiment, wherein reference sensor 11, selective absorption layer 13 and target sensor 12 are physically stacked, in the above-enumerated sequence and wherein the photosensitive array of the reference sensor is precisely aligned with the photosensitive array of the target sensor.

While sensor arrangements similar to the one depicted in FIG. 2 do exist in the art (e.g. Pat 9257475, Kalevo et al), their utilization in the device of the invention is distinctly novel.

Operating Modes

Referring again to FIG. 1, beam splitter 14 divides the beam of incident light is into a first light beam, 101 and a second light beam, 102. The two light beams exit the beam splitter in a predetermined intensity ratio, determined by the constructive characteristics of said beam splitter.

First light beam 101 directly strikes the reference sensor, while second light beam 102 strikes the target sensor, only after traversing selective absorption layer 13.

In the absence of a selective absorption layer, and assuming precise alignment between the photosite arrays of the two sensors, the light intensity, measured at corresponding, or homologous, photosites in each array would follow the predetermined ratio imposed by the beam splitter.

Figure 3:
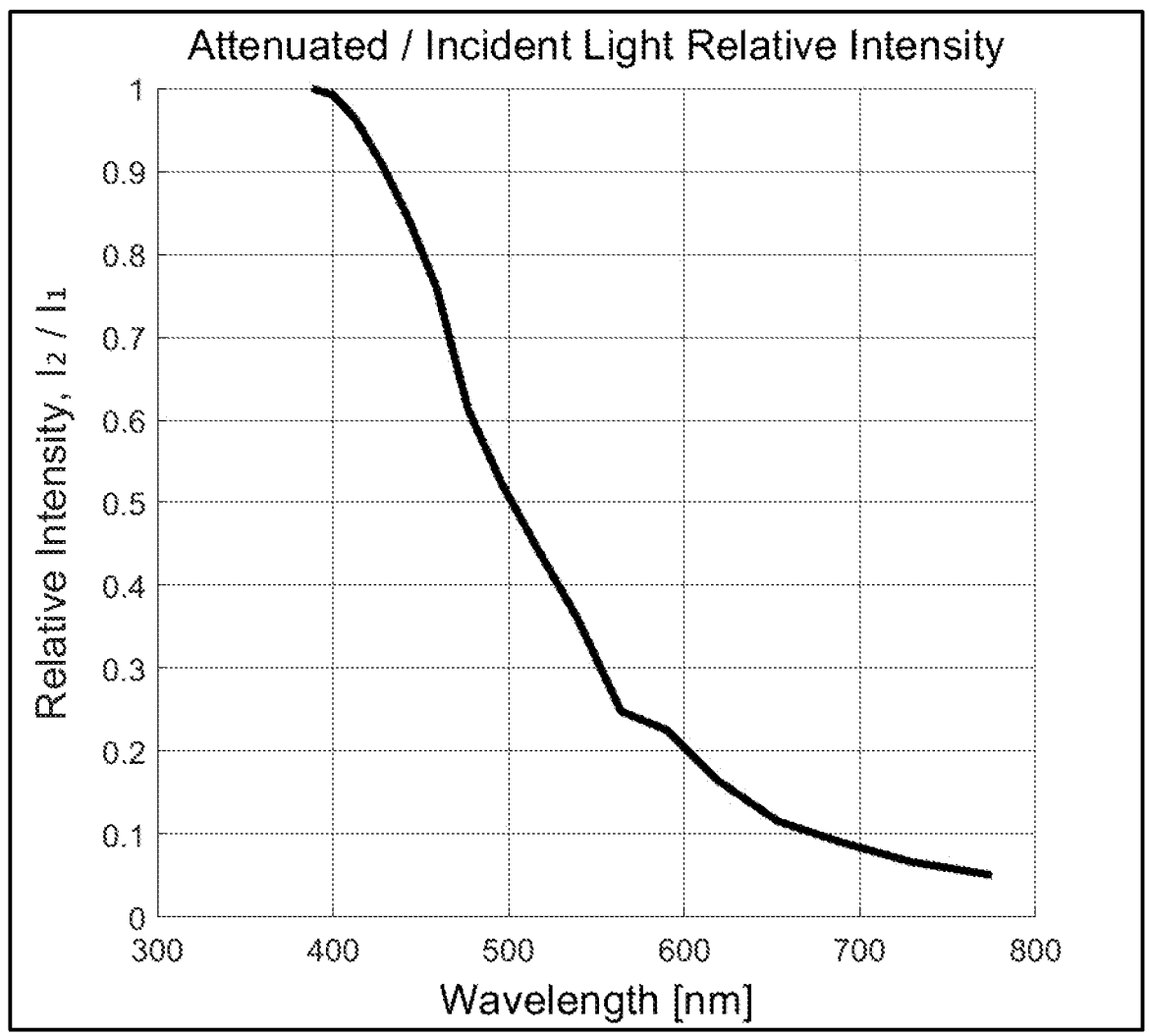
FIG. 3 illustrates the effects of selective wavelength absorption, on emergent light intensity.

However, as illustrated by FIG. 3, the incident light is partially absorbed by traversing the selective absorption layer, subsequently attenuating the intensity of the light beam striking the target sensor. Thus, the wavelength of the incident light can be determined by processing the relationship, preferably expressed as a ratio, of the incident light intensity, $I_1$, as measured at the reference sensor, to the intensity of the partially absorbed, or attenuated, light, $I_2$, measured at the corresponding photosite of the target sensor.

Combining the unaltered light intensity, $I_1$, as measured at the reference sensor, with the derived wavelength, uniquely characterizes the image brightness and hue, at each photosite location.

Figure 4A:
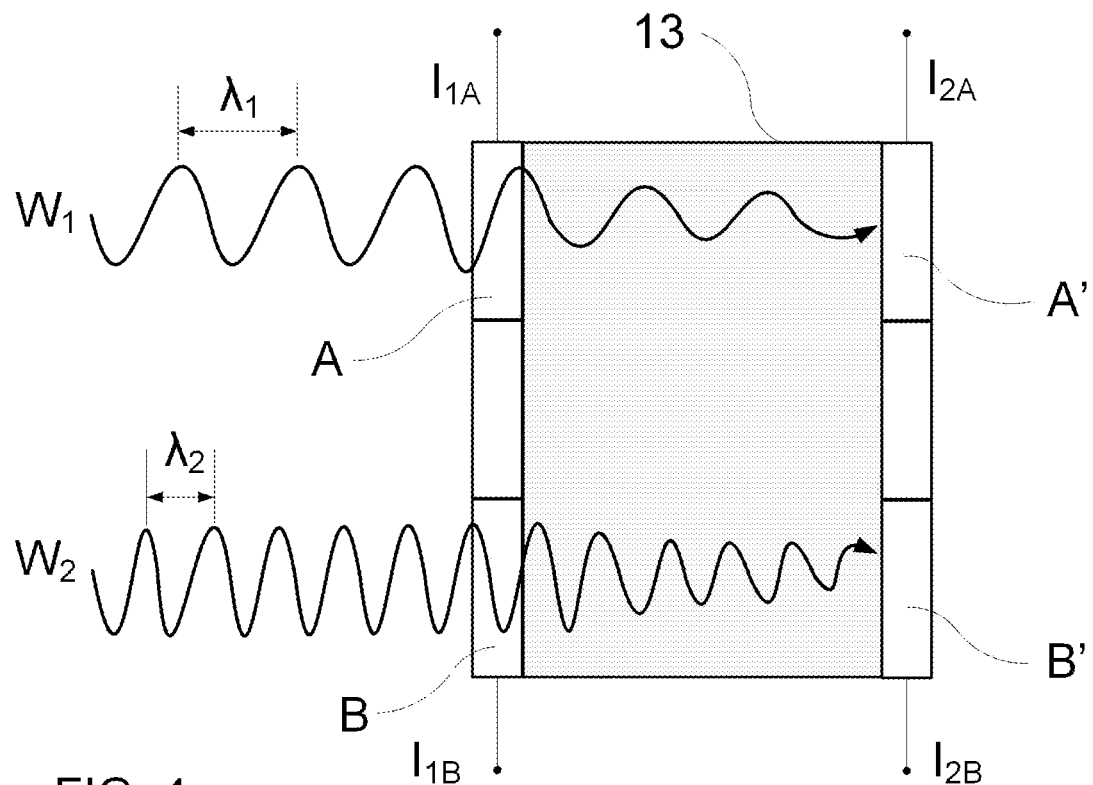
FIGS. 4a and 4b offer an example of the operating principle of the device of the invention.
Figure 4B:
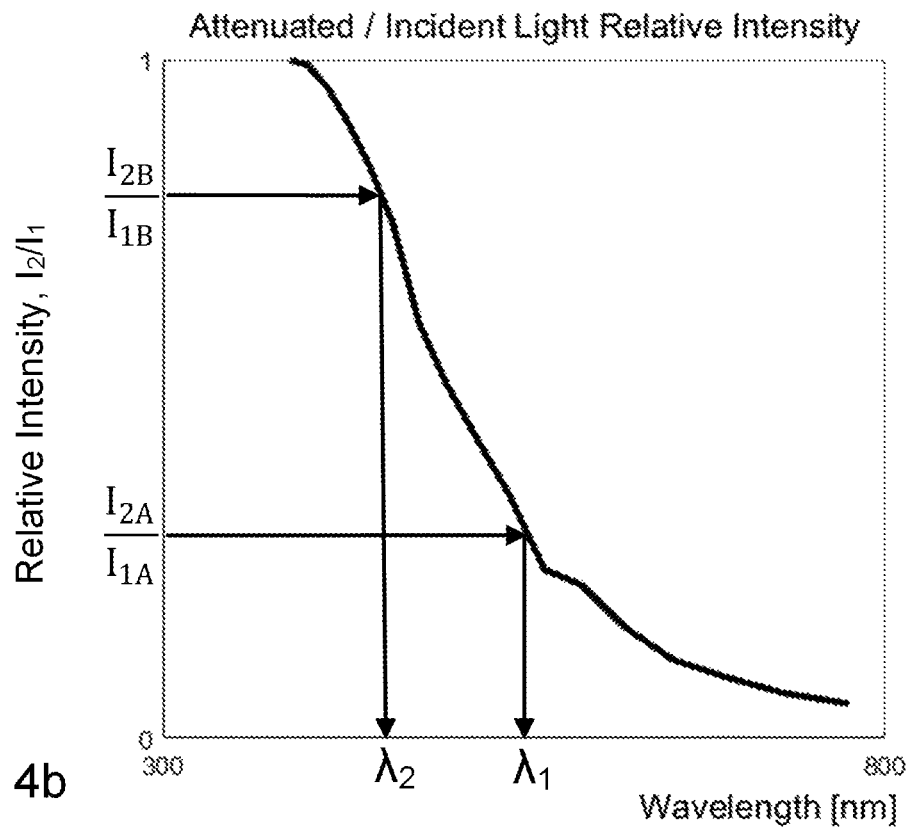

FIG. 4a and FIG. 4b offer an example of the wavelength determination, according to the invention.

FIG. 4a shows a first incident light ray, $W_1$, of wavelength $\lambda_1$, and a second incident light ray, $W_2$, of wavelength $\lambda_2$, striking two reference photosites, A and B, respectively. $I_{1A}$ and $I_{1B}$ represent light intensity, measured at photosites A and B, using measurement means well-known in the art (e.g. electrical current measurement).

Subsequent to striking reference photosites A and B, light rays $W_1$ and $W_2$ travel through said selective absorption layer 13, wherein each ray incurs an energy loss, inversely related to its wavelength. For visualization purposes, this energy loss, or attenuation, is graphically illustrated by the diminishing amplitude of the two light rays, in FIG. 4a.

Upon exiting the selective absorption layer, the attenuated ray $W_1$ strikes a target photosite A', and the attenuated ray $W_2$ strikes a target photosite B'.

$I_{2A}$ represents the intensity of the attenuated ray $W_1$, measured at target photosite A', and $I_{2B}$ denotes the intensity of the attenuated ray $W_2$, measured at target photosite B'.

For comparative illustration purposes, we assume wavelength $\lambda_1$ of ray $W_1$, to be substantially higher than wavelength $\lambda_2$ of ray $W_2$, therefore ray $W_1$ is attenuated more than ray $W_2$, by passing through the selective absorption layer, resulting in a lower relative intensity, preferably expressed as the exit-to-entry intensity ratio, $I_2/I_1$.

Referring now to FIG. 4b, it becomes apparent that the wavelengths $\lambda_1$ of ray $W_1$ and $\lambda_2$, of ray $W_2$, can be quantitatively determined by plotting the relative intensity ratios, $I_{2A}/I_{1A}$, and $I_{2B}/I_{1B}$, respectively, against the light absorption curve specific to the selective absorption layer.

Use of mathematical, or empirical curves in practical devices is routinely done in the art, e.g. in the form of electronically-accessible lookup tables.

Figure 5A:
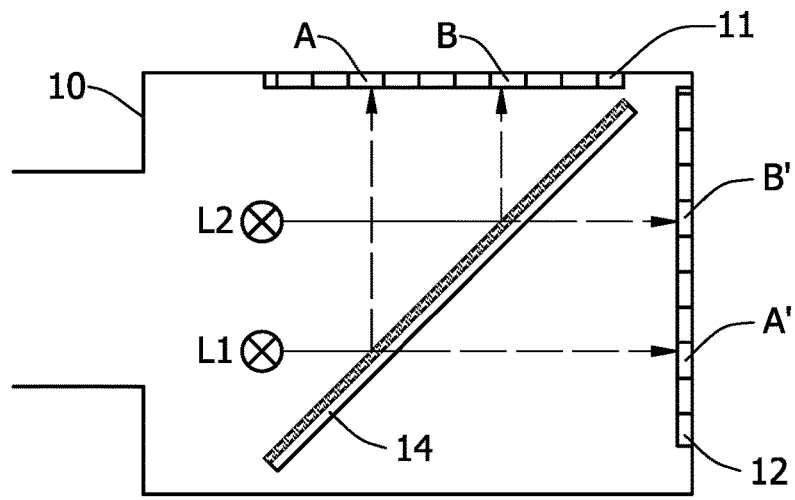
FIGS. 5a and 5b depict a simple, yet effective means for precisely aligning two light sensor arrays.

FIG. 5a depicts a simple, yet effective means for precisely aligning the two light sensors of FIG. 1.

In its preferred embodiment, the device of the invention further comprises at least two calibration light sources, internal to the image acquisition device and preferably of the laser type. As illustrated by FIG. 5a, each of a first light source L1, and a second light source L2, emits a preferably collimated and substantially narrow calibration beam, preferably in the infrared spectrum, and preferably in a direction substantially parallel to the incident light beam.

The calibration beams follow the same optical path as the incident light, being divided by the beam splitter and striking substantially small photosite groups, on each of the two sensors. For clarity and without changing the functional principle of the device, said photosites groups can be assumed as consisting of only one photosite, each.

In the schematic representation of FIG. 5a, light emitted by first light source L1 strikes reference sensor 11 at reference photosite A and falls on target sensor 12 at target photosite A'.

Similarly, light emitted by second light source L2 strikes reference sensor 11 at reference photosite B and falls on target sensor 12 at target photosite B'.

Figure 5B:
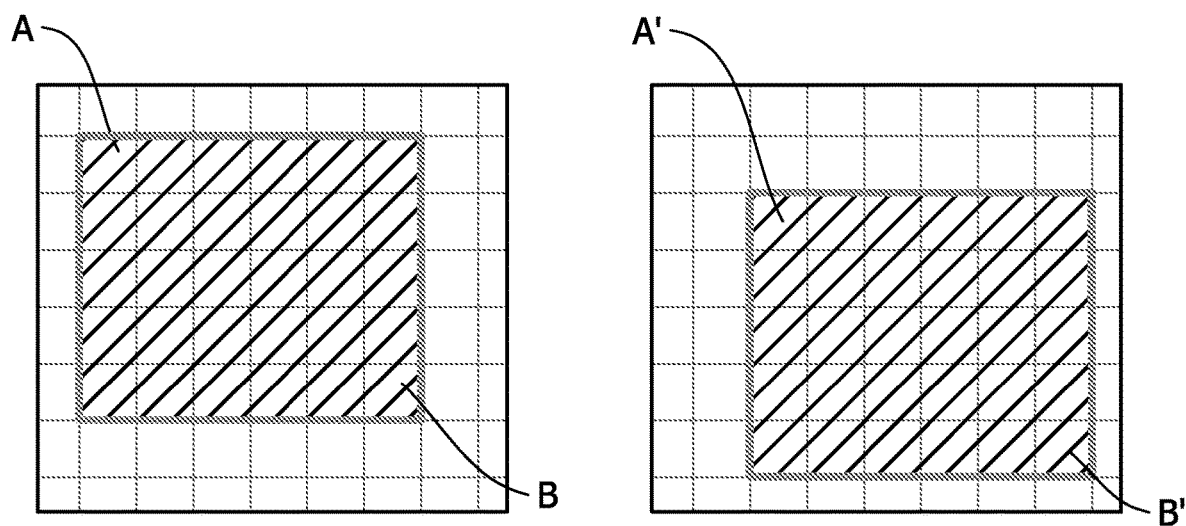

As shown in FIG. 5b, the array coordinates of the corresponding photosite pairs, A-A' and B-B' on each sensor can be determined by detecting the correspondingly illuminated photosites, on each of the two sensors.

The target photosites locations, relative to each sensor's photosites array is used for indexing a pair of corresponding sub-arrays, one on each sensor, which are now inherently aligned.

Thus, precise alignment of the two sensor arrays can be realized and verified, without physically moving any of the sensors. It is understood that an arbitrary number of calibration light sources may be used, to improve alignment precision.

CONCLUSION, RAMIFICATIONS AND SCOPE

Thus, the reader will see that the image acquisition device of the invention provides a simple, yet effective solution for capturing the color information of the image, without introducing the color artifacts or color contamination, characteristic of the prior art techniques. Furthermore, the device of the invention may be used for dynamic range expansion.

I claim:

1. An image acquisition device comprising an array of reference photosensitive-elements, hereinafter referred to as photosites, an array of target photosites, and a selective absorption layer constructed from a material capable of selectively absorbing light of different wavelengths, said selective absorption layer being interposed betwixt the reference and target photosites arrays,
    wherein the reference photosites array and target photosites array are identical;
    wherein said reference photosites array is precisely aligned to said target photosites array, thereby causing the target and reference photosites arrays to be exposed to light of the same wavelength,
    said image acquisition device further comprising measurement means capable of determining the intensity of the light, at each reference and each target photosite, and a processor, capable of determining the relationship between the light intensity at target photosites and reference photosites,
    wherein said reference photosites array is directly exposed to an incident light beam, entering said image acquisition device, whereas the same light beam is coerced to traverse the selective absorption layer, prior to impinging against said target photosites array, causing a difference between the intensity of the light falling on identically indexed target photosites and reference photosites, said difference being unambiguously dependent on the incident light wavelength, and thereby the wavelength of a light beam striking the identically indexed target photosites and reference photosites being determined by the processor programmed for processing said light intensity difference, in combination with the unaltered light intensity, at the reference photosites array.

2. The image acquisition device of claim 1, wherein light sensitivity factors of the two arrays are independently adjusted, thereby effectively expanding the dynamic range of an acquired image.

3. The image acquisition device of claim 1 further comprising a beam splitter, whereby the incident light beam is divided into a first light beam and a second light beam, said first light beam directly striking said reference photosites array, and said second light beam being coerced to successively traverse said selective absorption layer and impinge on said target photosites array.

4. The image acquisition device of claim 3, further comprising at least two internal light sources, and wherein each of the internal light sources emits a substantially narrow calibration beam in the direction of the two photosites arrays, thereby permitting uninterrupted re-alignment of the two arrays, by assigning the same array indices to the correspondingly illuminated photosites, in each array, and without physically moving any of the two photosites arrays.

* * * * *